US008956694B2

(12) United States Patent
Takeguchi et al.

(10) Patent No.: US 8,956,694 B2
(45) Date of Patent: Feb. 17, 2015

(54) DEVELOPING APPARATUS, DEVELOPING METHOD AND STORAGE MEDIUM

(75) Inventors: Hirofumi Takeguchi, Koshi (JP); Tomohiro Iseki, Hsin-Chu (TW); Yuichi Yoshida, Koshi (JP); Kousuke Yoshihara, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 419 days.

(21) Appl. No.: 12/904,458

(22) Filed: Oct. 14, 2010

(65) Prior Publication Data
US 2011/0096304 A1  Apr. 28, 2011

(30) Foreign Application Priority Data

Oct. 23, 2009 (JP) ................. 2009-244820

(51) Int. Cl.
*B05D 3/12* (2006.01)
*G03C 5/29* (2006.01)
*G03F 7/30* (2006.01)

(52) U.S. Cl.
CPC ................... *G03F 7/3021* (2013.01)
USPC ........... 427/240; 427/337; 427/425; 430/434; 118/52; 118/320; 438/780; 438/782

(58) Field of Classification Search
CPC ........................... G03F 7/3021; H01L 21/6715
USPC ............ 427/240, 425, 337, 340; 118/52, 320; 438/780, 782; 430/434
See application file for complete search history.

(56) References Cited

U.S. PATENT DOCUMENTS

| 5,885,755 A * | 3/1999 | Nakagawa et al. ............ 430/325 |
| 6,248,175 B1 * | 6/2001 | Subramanian et al. ........ 118/712 |
| 2001/0050050 A1 * | 12/2001 | Nishiya et al. ................. 118/668 |
| 2006/0040051 A1 * | 2/2006 | Yamamoto et al. ........... 427/240 |
| 2009/0311632 A1 * | 12/2009 | Takeguchi et al. ............. 430/322 |

FOREIGN PATENT DOCUMENTS

| JP | 2002-075854 A1 | 3/2002 |
| JP | 2003-272988 A * | 9/2003 |
| JP | 2006-060084 A1 | 3/2006 |

OTHER PUBLICATIONS

JPO computer translation of JP 2003-272988 A, published Sep. 2003.*

* cited by examiner

*Primary Examiner* — Kirsten Jolley
(74) *Attorney, Agent, or Firm* — Burr & Brown, PLLC

(57) ABSTRACT

A pretreatment process, carried out prior to a developing process, spouts pure water, namely, a diffusion-assisting liquid for assisting the spread of a developer over the surface of a wafer, through a cleaning liquid spouting nozzle onto a central part of the wafer to form a puddle of pure water. The developer is spouted onto the central part of the wafer for prewetting while the wafer is rotated at a high rotating speed to spread the developer over the surface of the wafer. The developer dissolves the resist film partly and produces a solution. The rotation of the wafer is reversed, for example, within 7 s in which the solution is being produced to reduce the water-repellency of the wafer by spreading the solution over the entire surface of the wafer. Then, the developer is spouted onto the rotating wafer to spread the developer on the surface of the wafer.

7 Claims, 9 Drawing Sheets

DEVELOPING APPARATUS, DEVELOPING METHOD AND STORAGE MEDIUM

BACKGROUND OF THE INVENTION

1. Field of the Invention the present invention relates to techniques for processing a substrate coated with a resist film and processed by an exposure process for development by a developing process.

2. Background of the Invention

A photoresist pattern forming process, namely, one of semiconductor device fabricating processes, forms a resist film on a surface of a semiconductor wafer (hereinafter, referred to simply as "wafer"), exposes the resist film to light in a predetermined pattern, and then develops the exposed resist film by a developing process using a developer to form a resist pattern. A known developing process mentioned in JP-A 2006-60084 holds a wafer by a spin chuck, namely, a substrate holding device, spouts a developer onto the wafer through a developer spouting nozzle moving from a position above the circumference of the wafer toward a position above the center of the wafer while the wafer is rotated about a vertical axis.

A known exposure system processes a wafer by an immersion exposure process which form a liquid film, such as a pure water film, over the wafer to attain high exposure resolution. Studies have been made to make the immersion exposure process achieve a throughput equal to that of the conventional exposure system by improving the follow-up scanning performance of an immersed part of the exposure system, namely, the tip of the lens, by forming a highly water repellent protective film on a resist film or by forming a highly water repellent resist film. The water repellency of those films has been progressively improved. However, the high water repellency of the surface of the wafer enhances difficulty in uniformly spreading a developer over the surface of the wafer in a developing process. Consequently, it is possible that the degree of defective development increases with the further minimization of the minimum feature size of patterns.

Developing methods mentioned in JP-A 2006-60084 and JP-A 2002-75854 coat a rotating wafer with a developer by rotating the wafer in one direction and then rotating the wafer in the opposite direction while the developer is being continuously spouted onto the wafer. If the surface of the wafer has high water repellency, it is difficult to spread the developer uniformly particularly in a circumferential part of the surface and the above-mentioned problems cannot be solved.

SUMMARY OF THE INVENTION

The present invention has been made under such circumstances and it is therefore an object of the present invention to provide a developing apparatus and a developing method capable of highly uniformly processing the surface of a substrate processed by an exposure process even if the surface has high water repellency and of reducing developing defects that are created by the developing process, and a storage medium for storing the program of the developing method.

The present invention provides a developing apparatus for processing a substrate coated with a resist film and processed by an exposure process for development by using a developer including: a substrate holding device for holding the substrate in a horizontal position; a rotating mechanism for rotating the substrate holding device about a vertical axis; a diffusion-assisting liquid spouting nozzle for spouting a diffusion-assisting liquid not having any developing effect and capable of assisting the diffusion of the developer on the substrate; a developer spouting nozzle for spouting the developer onto the substrate; and a control unit that provides control signals for controlling steps of spouting the diffusion-assisting liquid through the diffusion-assisting liquid spouting nozzle onto a central part of the substrate to form a puddle of the diffusion-assisting liquid on the central part of the substrate held by the substrate holding device, spouting the developer onto the central part of the substrate being rotated in the normal direction by the rotating mechanism to spread the developer all over the surface of the substrate such that parts of the resist film is dissolved to produce a solution, rotating the substrate in the reverse direction by the rotating mechanism, and spouting the developer through the developer spouting nozzle onto the substrate to develop the resist film.

The developing apparatus may operate under the following conditions.

1. The diffusion-assisting liquid is pure water.
2. The step of rotating the substrate in the reverse direction is started within 7 s after starting spouting the developer onto the central part of the substrate being rotated in the normal direction.
3. The step of developing the resist film moves the developer spouting nozzle spouting the developer such that a position on the substrate at which the developer falls on the substrate moves from the circumference of the substrate toward the center of the substrate while the substrate is being rotated.

The present invention provides a developing method of processing a substrate coated with a resist film and processed by an exposure process by spouting a developer onto the substrate including the steps of: holding the substrate in a horizontal position by a substrate holding device; spouting a diffusion-assisting liquid capable of assisting the diffusion of the developer and ineffective in developing the exposed resist film onto a central part of the substrate through a diffusion-assisting liquid spouting nozzle to form a puddle of the diffusion-assisting liquid in a central part of the substrate held by the substrate holding device; spouting the developer onto the central part of the substrate being rotated in the normal direction by the rotating mechanism to produce dissolvable parts in the resist film by spreading the developer all over the surface of the substrate; spouting the developer through the developer spouting nozzle onto the substrate being rotated in the reverse direction; and developing the exposed resist film by spouting the developer through the developer spouting nozzle onto the substrate.

The developing apparatus of the present invention that wets the substrate with the developer forms a puddle of the diffusion-assisting liquid not having any developing effect on the central part of the substrate, spouts the developer onto the central part of the substrate being rotated in the normal direction, and then rotates the substrate for prewetting. The developer is born on the diffusion-assisting liquid and spreads all over the surface of the substrate with the assistance of the diffusion-assisting liquid. Consequently, dissolvable patterning parts of the resist film dissolve and adhere to nonpatterning parts of the resist film. Thus, contact angle between the developer and the surface of the substrate equivalent to the degree of repellency is small, and it is easy for the developer to spread uniformly all over the surface of the substrate for development. Consequently, the entire surface of the substrate can be highly uniformly processed for development and development defects can be reduced even if the surface of the exposed substrate has high water repellency.

DETAILED DESCRIPTION OF THE INVENTION

Figure 1:
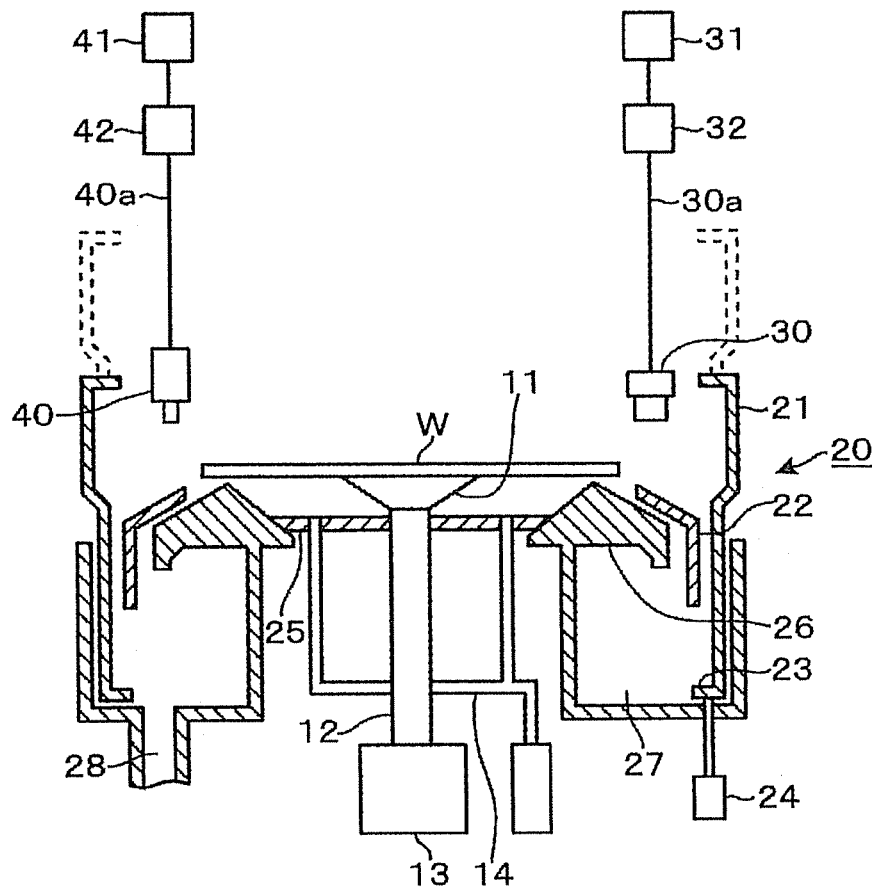
FIG. 1 is a longitudinal sectional view of a developing apparatus in a preferred embodiment of the present invention.
Figure 2:
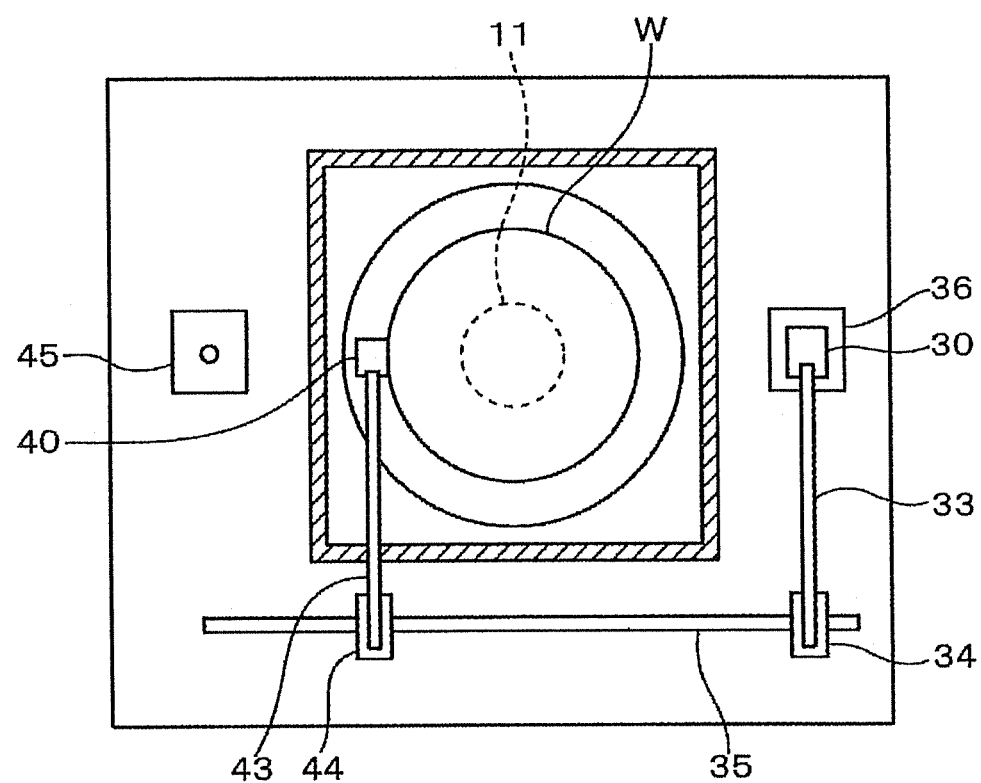
FIG. 2 it a top view of the developing apparatus shown in FIG. 1.

Referring to FIGS. 1 and 2 showing a developing apparatus in a preferred embodiment according to the present invention, the developing apparatus is provided in its central part with a spin chuck 11, namely, a substrate holding device, for holding a wafer W, namely, a substrate, by suction. The spin chuck 11 is connected to a rotational drive unit 13 including, for example, a motor, by a drive shaft 12. The rotational drive unit 13 is disposed under the spin chuck 11. The spin chuck 11 can be vertically moved by a lifting mechanism incorporated into the rotational drive unit 13. The rotational drive unit 13 can rotate the drive shaft 12 in the normal and the reverse direction. Normal rotation and reverse rotation do not necessarily correspond to clockwise rotation and counterclockwise rotation, respectively. Either of clockwise rotation and counterclockwise rotation and the other rotation may be used to describe rotating the wafer sequentially in opposite directions for convenience.

The developing apparatus has a splash cup 20 surrounding a wafer W held by the spin chuck 11. The splash cup 20 includes an outer cup 21 and an inner cup 22. The splash cup 20 has an open upper end. The outer cup 21 has an upper part having the shape of a quadrilateral cylinder and a lower part having the shape of a circular cylinder. An inner flange 23 is formed at the lower end of the outer cup 21. The outer cup 21 can be vertically moved by a lifting mechanism 24 disposed below the outer cup 21. The inner cup 22 has a lower part of the shape of a circular cylinder and an upper part of an upward tapered truncated cone. When the outer cup 21 is lifted, the inner flange 23 comes into contact with the lower end of the inner cup 22 to lift up the inner cup 22 together with the outer cup 21.

A circular plate 25 is disposed under the wafer W held by the spin chuck 11. The circular plate 25 is surrounded by a guide ring 26 having a ridge-shaped cross section. The guide ring 26 guides a developer and a cleaning liquid spilled from the wafer W to an annular liquid sump 27 having a U-shaped cross section. The liquid sump 27 surrounds the circular plate 25. A drain pipe 28 is connected to and extended down from the bottom wall of the liquid sump 27 and is connected to a drainage tank, not shown. A gas-liquid separator is placed in the drain pipe 28 to separate waste gases and waste liquids. The developing apparatus has, for example, three lifting pins 14 extending vertically up through the circular plate 25. The wafer W can be transferred to and taken away from the spin chuck 11 by the cooperative operation of the lifting pins 14 and a substrate carrying arm, not shown.

Figure 3:
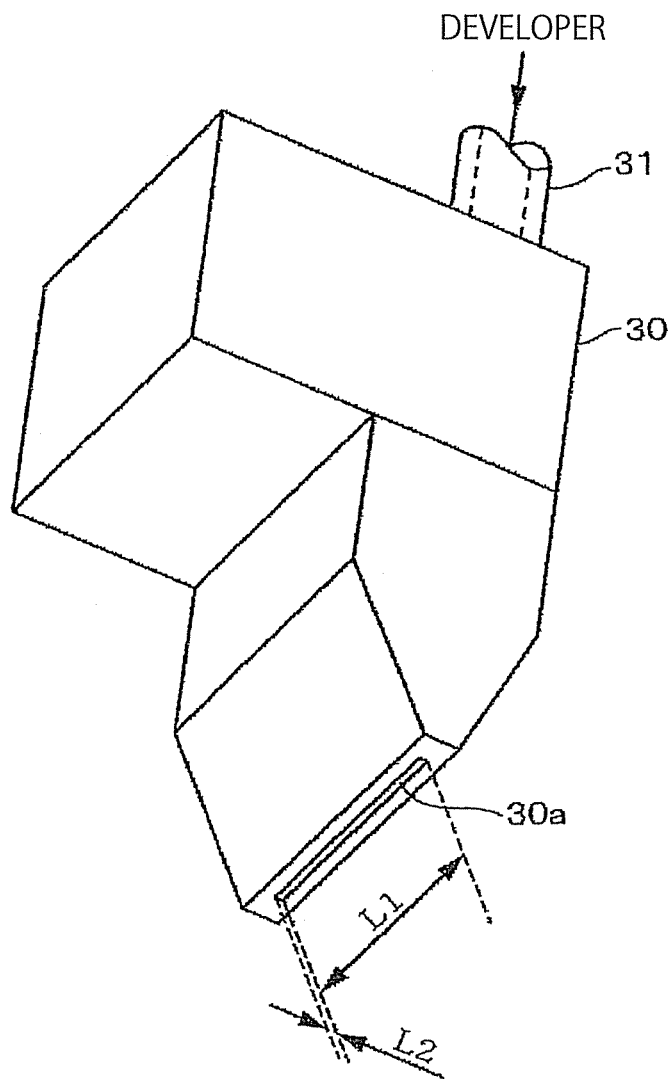
FIG. 3 is a perspective view of a developer spouting nozzle included in the developing apparatus shown in FIG. 1.
Figure 4:
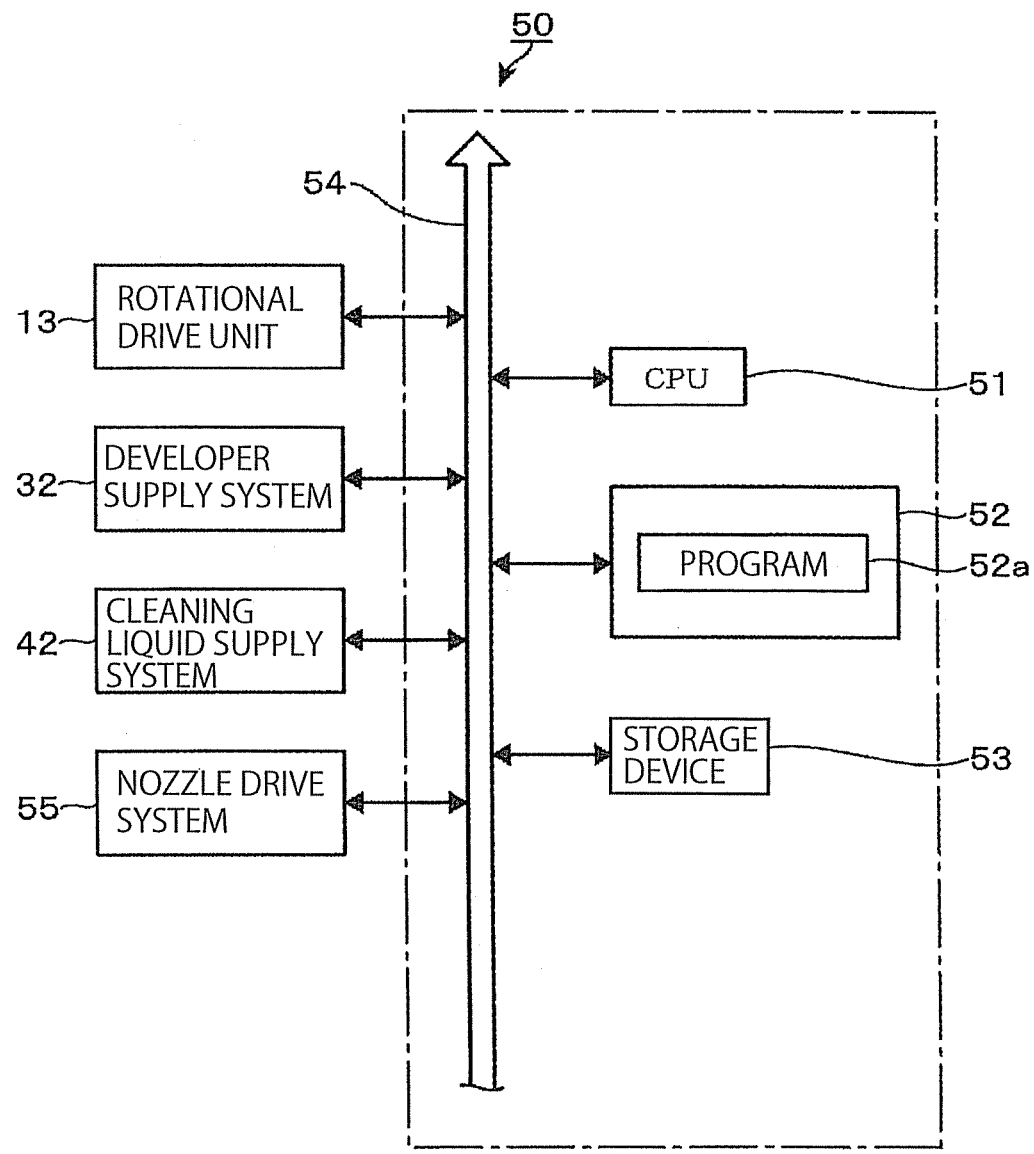
FIG. 4 is a block diagram of a control unit for controlling the developing apparatus shown in FIG. 1.

The developing apparatus is provided with a developer spouting nozzle 30 and a cleaning liquid spouting nozzle 40. Each of the nozzles 30 and 40 can move from its home position to a space above the wafer W held by the spin chuck 11. As shown in FIG. 3, the developer spouting nozzle 30 has a lower end wall provided with a spouting slit 30a of a length L1 and a width L2. The length L1 is, for example, in the range of 8 to 15 mm and the width L2 is, for example, in the range of 0.1 to 1 mm.

The developer spouting nozzle 30 is connected to a developer supply system 32 by a developer supply pipe 30a. The developer supply system 32 includes a developer tank 31 and a liquid supply controller including valves and a pump. As shown in FIG. 2, a nozzle support arm 33, namely, a support member, has one end supporting the developer spouting nozzle 30 thereon and the other end connected by a lifting mechanism, not shown, to a moving member 34. The moving member 34 can move along a guide rail 35 extended in the X-direction. Indicated at 36 in FIG. 2 is the home position of the developer spouting nozzle 30. The developer spouting nozzle 30 treated for cleaning and such at the home position 36.

The cleaning liquid spouting nozzle 40 spouts a cleaning liquid, such as pure water, onto the wafer W. The cleaning liquid spouting nozzle 40 is connected to a cleaning liquid supply system 42 by a cleaning liquid supply pipe 40a. The cleaning liquid supply system includes a cleaning liquid tank 41 and cleaning liquid supply controller including valves and a pump. As shown in FIG. 2, a nozzle support arm 43 has one end supporting the cleaning liquid spouting nozzle 40 thereon and the other end connected to a moving member 44 by a lifting mechanism, not shown. The moving member 44 can move along the guide rail 35 extended in the X-direction.

Figure 5:
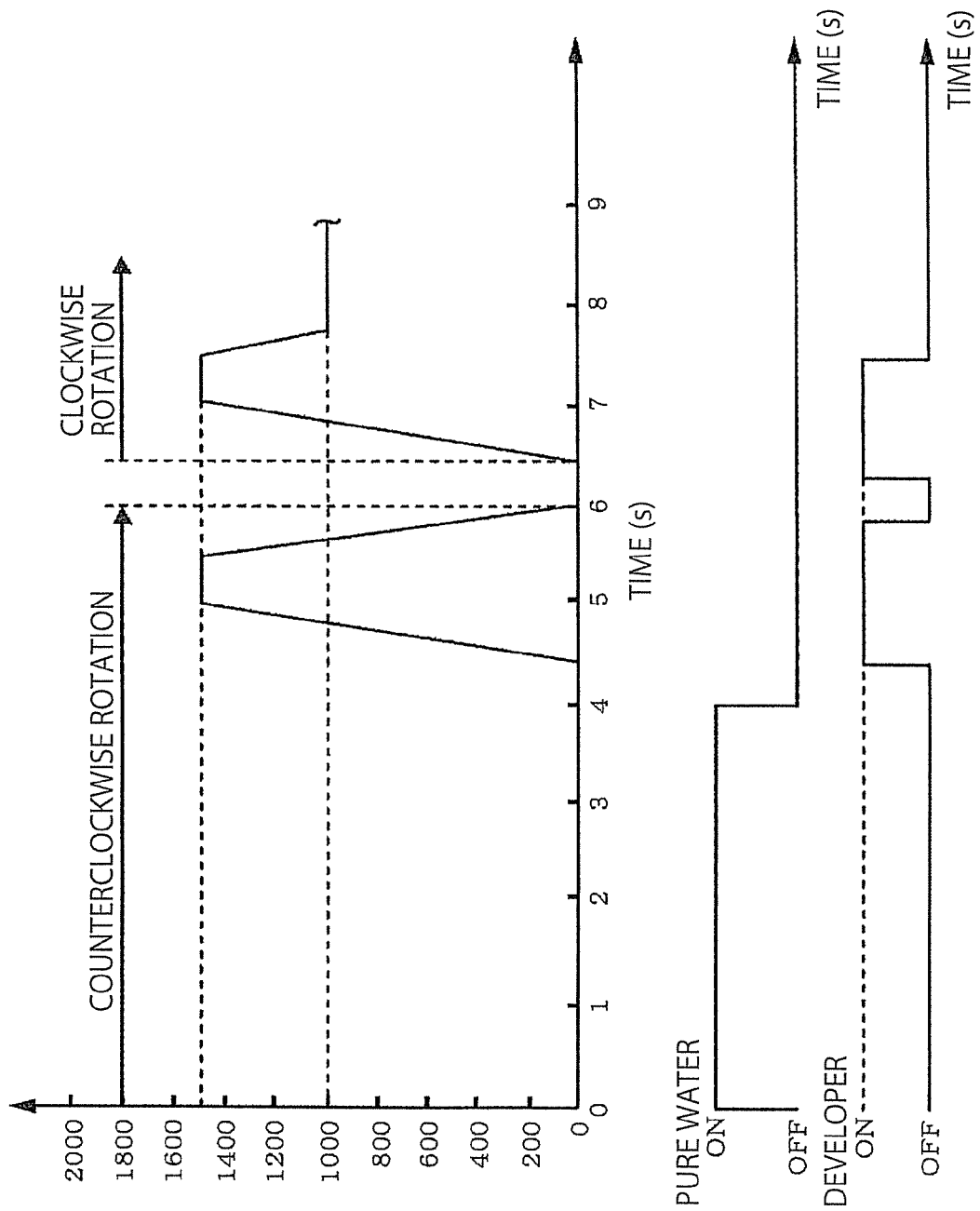
FIG. 5 is a diagram of assistance in explaining the chamber of the rotating speed and the rotating direction of a wafer with time.

FIGS. 1 and 5 show a control unit 50 for controlling the components of the developing apparatus. The control unit 50 is a computer including, for example, a CPU 51, a program storage device 52 storing a program 52a, a storage device 53 and a data bus 54. The program 52a is a set of instructions for controlling the rotational driving unit 13, the developer supply system 32, the cleaning liquid supply system 42 and a nozzle drive system 55 according to a process recipe to carry out a developing process.

A developing method to be carried out by the developing apparatus to process a wafer W for development will be described. Suppose that a wafer W carried into the developing apparatus is coated with a highly water-repellent resist film or with a resist film and a highly water-repellent protective film formed on the resist film, and has been processed by an immersion exposure process by an exposure system. The static contact angle between the surface of the wafer W and water is, for example, 85° or above. The wafer W is carried into the developing apparatus by a carrying arm, not shown, after the outer cup 21 and the inner cup 22 of the developing apparatus have been moved down to their lower positions indicated by continuous lines in FIG. 1 and the developer spouting nozzle 30 and the cleaning liquid spouting nozzle 40 are held at their home positions 36 and 45, respectively. The wafer W is placed on the spin chuck 11 by the cooperative operation of the carrying arm and the lifting pins 14 and is held by suction on the spin chuck 11.

Then, a pretreatment process is carried out prior to the developing process. The pretreatment process is a prewetting process for diminishing contact angle between the surface of the wafer W and the developer to facilitate spreading the developer over the surface of the wafer W because the surface of the wafer W is highly water-repellent and it is difficult for the developer spouted onto the wafer W to spread all over the surface of the wafer W. FIG. 5 is a diagram showing the rotating speed of the wafer W with time and timing of spouting pure water and the developer. Referring to FIG. 5, the cleaning liquid spouting nozzle 40 is located at a position corresponding to a central part of the wafer W, and then pure water, namely, a diffusion-assisting liquid for assisting the diffusion of the developer, is spouted onto the wafer W, for example, for 4 s while the wafer W is being rotated clockwise, for example, at 10 rpm. Subsequently, the cleaning liquid spouting nozzle 40 is moved to a position at a distance from the position above the central part of the wafer W and the developer spouting nozzle 30 previously located at a position near the position above the central part of the wafer W to the position above the central part of the wafer W. As mentioned above the developer spouting nozzle 30 is provided with the spouting slit 30a. The developer spouting nozzle 30 is located such that a middle part of the spouting slit 30 with respect to length is located, for example, above the central part of the wafer W. Time between the separation of the cleaning liquid spouting nozzle 40 from the position above the central part of the wafer W and the arrival of the middle part of the spouting slit 30a of the developer spouting nozzle 3 at the position above the central part of the wafer W is, for example, 0.5 s.

Then, the developer is spouted, for example, for 1 s through the developer spouting nozzle 30, the wafer W is rotated counterclockwise and the rotating speed of the wafer W is increased from 10 rpm up to 1500 rpm. Start of increasing the rotating speed is timed such that the rotating speed starts increasing immediately after the developer spouted through the developer spouting nozzle 30 has arrived at the wafer W. When the wafer W is thus rotated at a high rotating speed, a puddle of pure water formed on the central part of the wafer W is caused to spread toward the circumference of the wafer W. Although the surface of the wafer W is highly water repellent, pure water spreads uniformly because much pure water forms a puddle on the central part of the wafer W. The developer spouted through the developer spouting nozzle 30 is born on the pure water on the wafer W and spreads together with the pure water or runs over the spreading pure water. Thus, the developer diffuses uniformly. The pure water functions as the diffusion-assisting liquid for uniformly diffusing the developer.

After the developer has been spread, i.e., after the developer has been diffused, over the surface of the wafer W being rotated in the normal direction, the rotation of the wafer W is reversed. In this embodiment, the rotating direction of the wafer W is changed from the counterclockwise direction to the clockwise direction. After the rotating direction of the wafer W has been changed, the wafer W is rotated, for example, at 1500 rpm. The developer is spouted through the developer spouting nozzle 30 onto the central part of the wafer W while the wafer W is rotated in the clockwise direction. Spouting of the developer through the developer spouting nozzle 30 is interrupted during the transition of the rotating direction from the normal direction to the reverse direction.

Figure 6C:
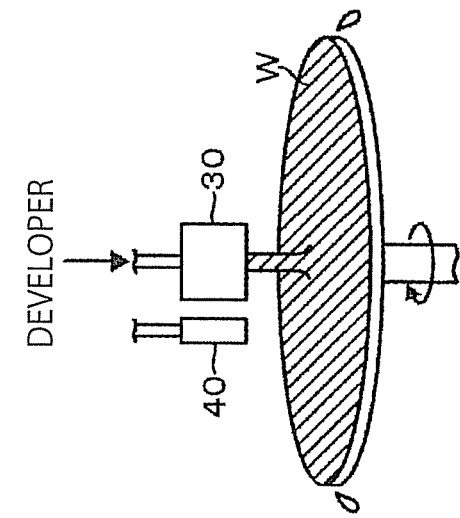
FIGS. 6A, 6B and 6C are perspective views of assistance in explaining a pretreatment process to be carried out prior to a developing process.
Figure 6B:
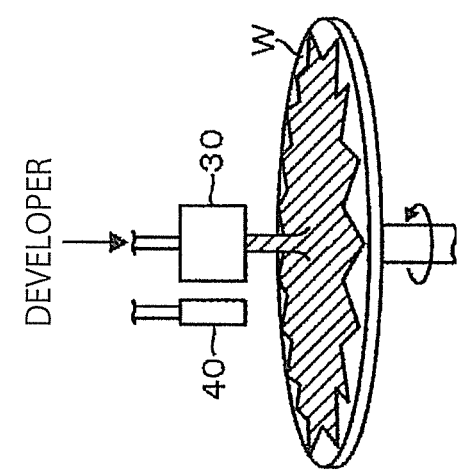
Figure 6A:
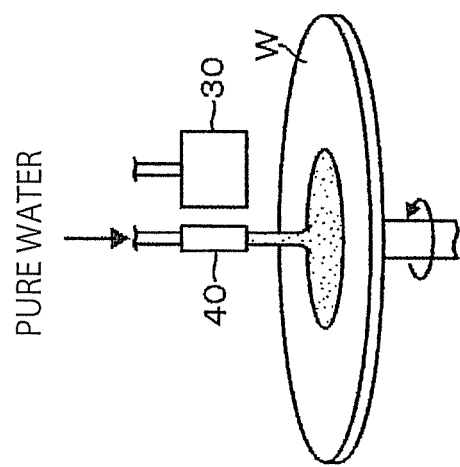

Then, the developing process is started. The significance of the operations in the pretreatment process, namely, the prewetting process, will be described prior to the description of the developing process. Pure water is spouted onto the wafer W prior to spouting the developer onto the wafer W. Since the surface of the wafer has high water repellency, the developer spouted onto the wafer W separates into developer drops and the developer drops flow in streaks toward the circumference of the wafer W if pure water is not spouted onto the wafer W prior to spouting the developer onto the wafer W. The pure water suppresses the separation of the developer into developer drops and prepares a condition for facilitating the spread of the developer. The amount of the pure water to be spouted onto the wafer W is 6 $cm^3$ or above. Since the rotating speed of the wafer W is as low as 10 rpm, a puddle of pure water is formed in a central part of the wafer W as shown in FIG. 6A. When pure water is spouted through the cleaning liquid spouting nozzle 40, the wafer W is rotated at a rotating speed suitable for forming a puddle of pure water on the wafer W or the rotation of the wafer W may be stopped.

The significance of wetting the entire surface of the wafer W beforehand for prewetting will be described. Normally, exposed parts 61 of the resist film dissolve as the hydrogen-ion activity of the solution wetting the surface of the resist film approaches pH 7 during the cleaning process subsequent to the developing process. The applicant of the present invention has knowledge that parts of a surface layer of the exposed parts 61 of the resist film are dissolved even in an initial stage of the developing process, and the contact angle between the surface of the wafer W and the developer is reduced by a solution 6 produced by dissolving parts of the resist film and adhering to the surface of the wafer W. When the developer is spread over the surface of the wafer W, a surface layer of the exposed parts 61 forming a pattern are dissolved to produce the solution 6. Only the surface layer of the resist film is dissolved because the developer is in contact with the exposed parts for a short time.

The solution 6 will be partially distributed on the surface of the wafer W if the wafer W is rotated only in one direction while the developer is spouted onto the central part of the wafer W. As the wafer W is accelerated to rotate the wafer W at a high rotating speed, a force acts in one direction on the solution 6. Consequently, the solution 6 is forced to flow from the exposed parts forming a pattern to unexposed parts not forming the pattern. The solution 6 adheres to the unexposed parts firmly and does not move easily.

Figure 7A:
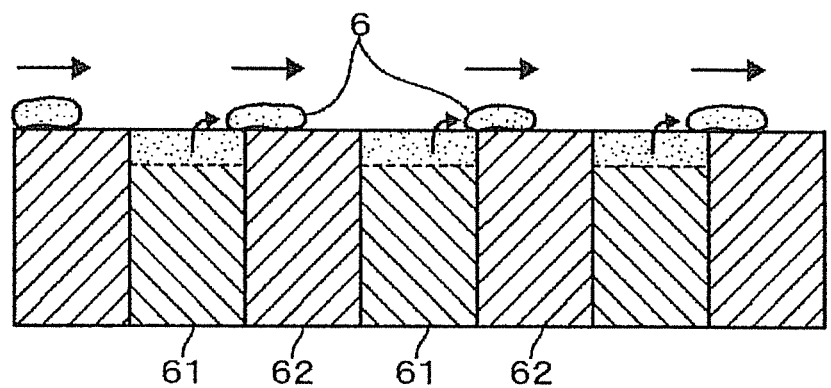
FIGS. 7A and 7B are typical sectional views of assistance in explaining the dissolution of a resist film into a solution and the spread of the solution.
Figure 7B:
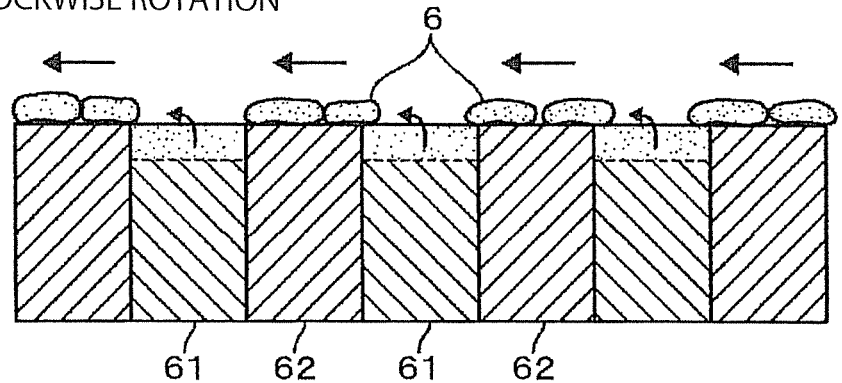

Such a condition will be schematically described. In FIG. 7A the solution 6 produced in the exposed parts 61 adheres to the surfaces of the unexposed parts 62 of the resist film on the right side of the surfaces of the exposed parts 61. The adhesion 6 of the solution is high as compared with centrifugal force that acts on the solution 6 when the wafer W rotates and adheres firmly to parts of the unexposed parts 62 adjacent to the exposed parts 61 on the left side thereof. Consequently, the unexposed parts 62 are wetted partially with the solution 6. For example, right parts of the unexposed parts 62 are bare and hence the contact angle between each of the bare parts of the surface of the resist film and the developer is large. Therefore, as mentioned above, the rotation of the wafer W is reversed to apply a force in the opposite direction so that the solution 6 is forced to flow in the opposite direction from the exposed parts 61 to ease or solve the partiality of the distribution of the solution 6. Thus, contact angle between every part of the surface of the wafer W and the developer is reduced. Dissolution of the exposed parts 61 to produce the solution 6 stops, for example, 7 s after the application of the developer to the wafer W. Therefore, the rotation of the wafer W needs to be reversed within such a period to force the developer 6 from the patterning parts to the nonpatterning parts.

The developing process will be described. The developer spouting nozzle 30 is moved from a position above the central part of the wafer W to a position above the circumference of the wafer W after prewetting has been completed. The wafer W is rotate, for example, at 500 rpm and the developer is spouted through the developer spouting nozzle 30 onto the wafer W as shown in FIG. 8A. The developer spouting nozzle 30 spouting the developer is moved from a position above the circumference of the wafer W to a position above the central part of the wafer W in, for example, about 2 s such that a position on the surface of the wafer W where the developer falls moves from the circumference to the center of the wafer W. Since the developer falls in a band on the surface of the wafer W while the wafer W is rotating, the surface of the wafer W can be completely coated with the developer. Since the wettability of the surface of the wafer W has been improved as mentioned above, the developer spreads uniformly over the surface of the wafer W for the developing process. The developer spouting nozzle 30 spouts the developer for a predetermined time, such as 5 s, at the position above the central part of the wafer W as shown in FIG. 8B, stops spouting the developer, and then returns to the home position. Thus, dynamic development is achieved. The wafer W may be processed by static development by interrupting the rotation of the wafer W, for example, for 45 s after stopping spouting the developer.

Then, the developer spouting nozzle 30 is retracted to the home position and the cleaning liquid spouting nozzle is moved to the position above the central part of the wafer W. Pure water is spouted through the cleaning liquid spouting nozzle 40 onto the central part of the wafer W to clean the surface of the wafer W. During the cleaning operation, the wafer is rotated, for example, at 500 rpm and pure water spouted onto the wafer W spreads from the central part toward the circumference of the wafer W to wash the developer off the wafer W. Thus, the hydrogen-ion activity of the solution wetting the surface of the resist approaches pH7. As mentioned above, the solution 6 is produced by dissolving the surface layer of the exposed parts 61 of the resist film and is washed off the wafer W by pure water. Then, the spouting of pure water is stopped, the cleaning liquid spouting nozzle 40 is returned to the home position, the lifting mechanism lifts up the outer cup 21 and the inner cup 22, and then, the wafer W is rotated, for example, at 2000 rpm for a predetermined time for spin drying. The carrying arm carries out the wafer W from the developing apparatus to complete the developing process.

The developing apparatus in this embodiment forms a puddle of pure water, namely, a diffusion-assisting liquid not having any developing effect on the central part of the wafer W and rotates the wafer W in the normal and the reverse direction while the developer is being spouted onto the central part of the wafer W for prewetting. The developer is born on the diffusion assisting liquid and spreads all over the surface of the wafer W with the assistance of the diffusion-assisting liquid. Consequently, the solution 6 produced by dissolving the patterning parts of the resist film adheres to the nonpatterning parts of the resist film. Thus, contact angle between the developer and the surface of the wafer W representing the degree of repellency is reduced, and hence it is easy for the developer to spread uniformly all over the surface of the wafer W for development. Consequently, the entire surface of the wafer W can be highly uniformly processed for development and development defects can be reduced even if the surface of the exposed wafer W has high water repellency.

Since the wettability of the wafer W is improved by the prewetting process, the splashing of the developer spouted onto the wafer W for development can be suppressed, contamination of the developing module can be prevented, and the amount of the developer necessary for the developing process can be reduced. A puddle of the developer can be easily formed on the surface of the wafer W and the puddle of the developer can be formed by a small amount of the developer.

The developing apparatus in this embodiment interrupts spouting the developer in the transition stage in which the rotating direction of the wafer W is changed from the normal direction to the reverse direction because the developer will be irregularly distributed over the surface of the wafer W if the developer is spouted on the stationary wafer W. The 'transition stage' is not limited to a phase in which the rotation of the wafer W is stopped and may include a decelerating phase in which the rotating speed of the wafer W is decreased before stopping the rotation of the wafer W and an acceleration phase in which the rotating speed of the wafer W is increased after resuming the rotation of the wafer W. However, the developer may be spouted in the 'transition stage' if the rotation of the wafer is reversed in a very short time and it is expected that the irregularity of distribution of the developer is insignificant.

Pure water is suitable for forming a puddle of the diffusion-assisting liquid not having any developing effect for prewetting. For example, a very dilute developer that will not practically affect the quality of the wafer finished by the developing process may be considered to be a diffusion-assisting liquid substantially not having a developing effect. Use of such a dilute developer as the diffusion-assisting liquid is included in the technical scope of the present invention.

The present invention needs to form a puddle of the diffusion-assisting liquid. Part in which the puddle of the diffusion-assisting liquid is to be formed is not limited to the central part of the wafer W. A puddle of the diffusion-assisting liquid may be formed on the entire surface of the wafer W. To put it still another way, a puddle of the diffusion-assisting liquid is formed at least in a central part of the wafer W.

Although the developing apparatus in this embodiment uses the developer spouting nozzle 30 for both the pretreatment process, namely, the prewetting process, and the developing process, two nozzles may be used exclusively for the pretreatment process and the developing process, respectively. The nozzle to be used exclusively for the pretreatment process has the shape of, for example, a cylinder provided with a round nozzle hole of a diameter in the range of, for example, 1 to 5 mm. The nozzle to be sued for the developing process is the same as the developer spouting nozzle 30.

Figure 8C:
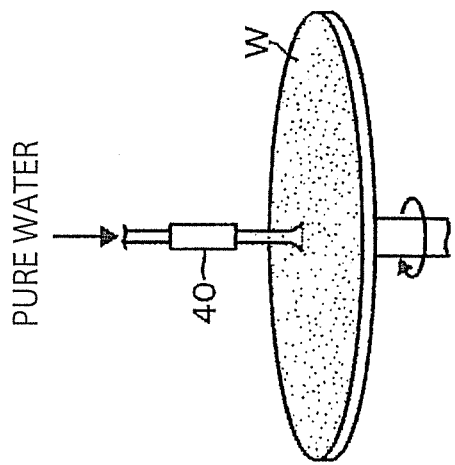
FIGS. 8A, 8B and 8C are perspective views of assistance in explaining a developing process.
Figure 8B:
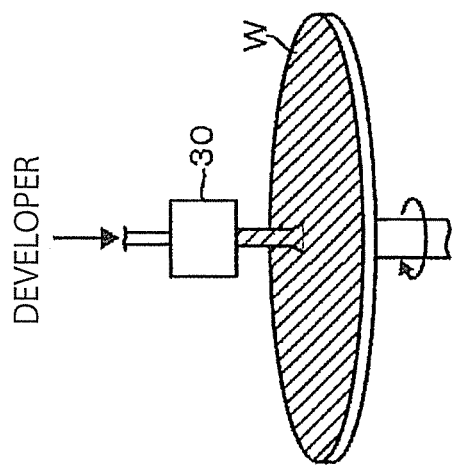
Figure 8A:
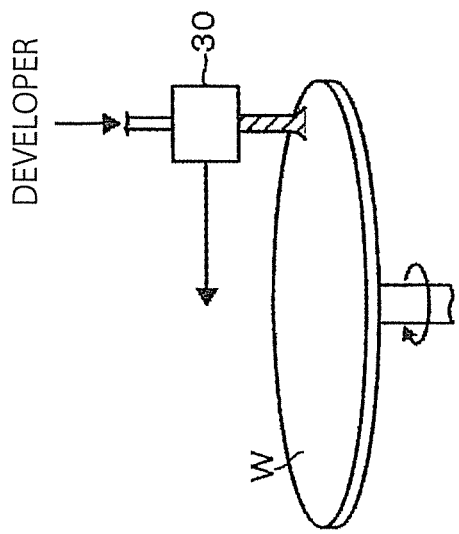

Steps of the developing process succeeding the prewetting process is not limited to those shown in FIGS. 8A to 8C. For example, the developer may be spread over the surface of the wafer W by moving a developer spouting nozzle having a spouting slit of a length equal to or greater than the diameter of the wafer W from a position corresponding to one of the diametrically opposite ends to a position corresponding to the other ends while the developer is being spouted through the developer spouting nozzle.

The developing apparatus in this embodiment may carry out a developing method described below instead of the foregoing developing method. The developing method described below includes a pretreatment process, namely, a prewetting process, partly different from that included in the foregoing developing method and is the same in other respects. Therefore, only steps of the developing process different from those of the foregoing developing process will be described.

A prewetting process included in this developing method rotates a wafer W in the counterclockwise direction and spouts pure water onto the rotating wafer W to form a puddle of pure water on the wafer W. Then, the developer is spouted onto the wafer W being rotated in the counterclockwise direction. Then, spouting the developer is interrupted and the rotation of the wafer W is reversed to rotate the wafer W in the clockwise direction and the clockwise rotation of the wafer W is continued without spouting the developer onto the wafer W. The sequence of rotation of the wafer W in this case is the same as that shown in FIG. 5. This prewetting process is different from the foregoing prewetting process in a developer spouting sequence that keeps spouting the developer stopped after the rotation of the wafer W has been reversed to rotate the wafer W in the clockwise direction.

The developer is not spouted after the rotation of the wafer W has been reversed because a dissolved part of some kind of resist dissolves easily in the developer and does not adhere easily to the undeveloped parts 62. Therefore, the developer is not spouted on the wafer W while the wafer is being rotated in the clockwise direction after the developer has been spread and the solution 6 has been produced while the wafer W is rotating in the counterclockwise direction to limit the dissolution of the solution 6 in the developer to the least possible extent. Thus, the solution 6 is spread by the developer remaining on the wafer W.

This prewetting process can suppress the excessive dissolution of the exposed parts 61 in the developer and can spread the solution 6 uniformly over the surface of the wafer W. Consequently, contact angle between the developer and the surface of the wafer W is reduced and the developer spreads easily all over the surface of the wafer W during the developing process. Consequently, the entire surface of the wafer W can be highly uniformly processed by the developing process and development defects can be reduced even if the surface of the wafer W after the exposure process has high water repellency.

Figure 9A:
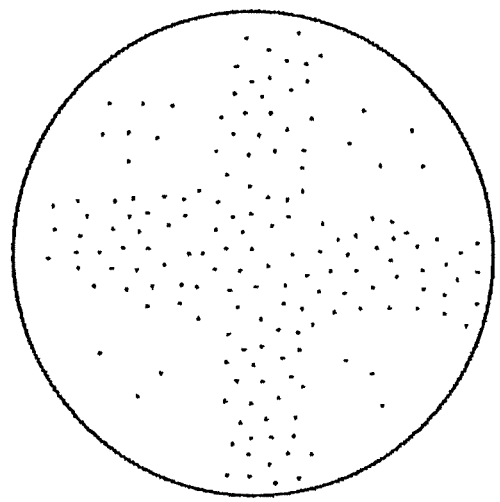
FIGS. 9A and 9B are typical views of the surfaces of wafers after prewetting.
Figure 9B:
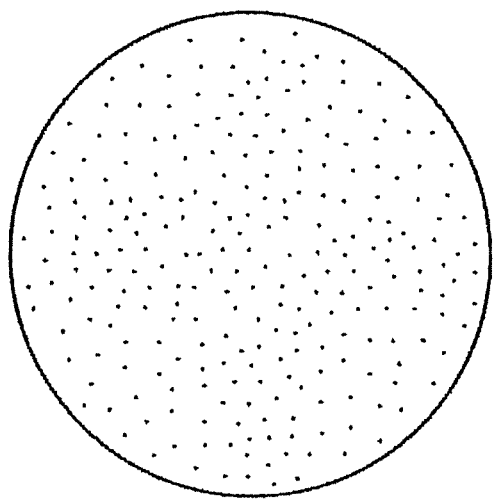

Results of experiments conducted to demonstrate the effects of the developing method of the present invention will be described. FIG. 9A shows the surface of a wafer W rotated only in the clockwise direction during the pretreatment process, namely, the prewetting process. FIG. 9B shows the surface of a wafer W processed by the pretreatment process, namely, the prewetting process, of the developing method of the present invention. The surfaces of those wafers W were inspected by a macrodefect inspector. Dots in FIGS. 9A and 9B are drops of the solution adhering to the surfaces of the wafers W. The solution is spread irregularly and not uniformly over the surface of the wafer W shown in FIG. 9A. The solution is spread uniformly over the surface of the wafer W shown in FIG. 913. Thus, it is known that the developing method of the present invention can uniformly spread the solution over the surface of the wafer W.

What is claimed is:

1. A developing method of processing a substrate coated with a resist film and processed by an exposure process by spouting a developer onto the substrate, said developing method comprising a prewetting process for prewetting the substrate coated with the resist film and a developing process for developing the substrate processed by the prewetting process, the prewetting process comprising the steps of:
holding the substrate in a horizontal position by a substrate holding device;
spouting a diffusion-assisting liquid through a diffusion-assisting liquid spouting nozzle onto only a central part of the substrate to form a puddle of the diffusion-assisting liquid on the central part of the substrate held by the substrate holding device;
spouting the developer through a developer spouting nozzle onto the puddle of the diffusion-assisting liquid in the central part of the substrate being rotated in a normal direction by a rotating mechanism to spread the developer and the diffusion-assisting liquid together towards the circumference and over the entire surface of the substrate such that parts of the resist film is dissolved to produce a solution for prewetting;
rotating the substrate in a reverse direction by the rotating mechanism within 7s after starting spouting the developer onto the central part of the substrate being rotated in the normal direction to distribute the solution for prewetting on the surface of the substrate, thereby reducing the contact angle between the entire surface of the substrate and the developer to be applied in the developing process; and the developing, process comprising the step of:
spouting the developer through the developer spouting nozzle onto the substrate to develop the resist film.

2. The developing method according to claim 1, wherein the diffusion-assisting liquid is pure water.

3. The developing method according to claim 1, wherein the developer is spouted through the developer spouting nozzle onto the central part of the substrate when the rotation of the substrate is reversed.

4. The developing method according to claim 3, wherein spouting the developer is interrupted in a transient period in which the rotating direction of the substrate is changed from a normal direction to a reverse direction.

5. The developing method according to claim 1, wherein the spouting of the developer is stopped when rotating the substrate in the reverse direction.

6. The developing method according to claim 1, wherein the spouting of the developer is restarted after a transient period and while the rotating direction of the substrate is in the reverse direction.

7. A non transitory storage medium storing a computer program specifying a set of instructions for controlling a developing apparatus that spouts a developer onto a rotating substrate to carry out the developing method according to claim 1.

* * * * *